United States Patent [19]
Ford et al.

[11] Patent Number: 5,761,214
[45] Date of Patent: Jun. 2, 1998

[54] METHOD FOR TESTING INTEGRATED CIRCUIT DEVICES

[75] Inventors: Christopher Joseph Ford, Cambridge; Arthur Jerome Wager, Essex Town, both of Vt.

[73] Assignee: International Business Machines Corporation, Armonk, N.Y.

[21] Appl. No.: 962,952

[22] Filed: Oct. 16, 1992

[51] Int. Cl.$^6$ .................................................. G01R 31/28
[52] U.S. Cl. ........................................ 371/22.6; 371/27.1
[58] Field of Search .............................. 371/15.1, 22.1, 371/22.5, 22.6, 24, 27, 28

[56] References Cited

U.S. PATENT DOCUMENTS

| | | | |
|---|---|---|---|
| 3,560,837 | 2/1971 | Gately | 321/14 |
| 3,736,506 | 5/1973 | Griffin | 324/765 |
| 3,883,802 | 5/1975 | Puri | 371/27.1 |
| 3,889,188 | 6/1975 | Trindade | 324/769 |
| 4,495,622 | 1/1985 | Charruau | 371/22.1 |
| 4,588,945 | 5/1986 | Groves et al. | 371/22.6 |
| 4,635,259 | 1/1987 | Schinabeck et al. | 371/22.6 |
| 4,637,020 | 1/1987 | Schinabeck | 371/22.1 |
| 4,646,299 | 2/1987 | Schinabeck et al. | 371/25.1 |
| 4,709,171 | 11/1987 | Main | 327/327 |
| 4,710,704 | 12/1987 | Ando | 324/103 R |
| 4,864,219 | 9/1989 | Parsons | 371/22.6 |
| 4,985,672 | 1/1991 | Hashimoto et al. | 324/537 |
| 5,111,459 | 5/1992 | DeVigne | 371/27.3 |
| 5,134,638 | 7/1992 | Stephens et al. | 371/22.6 |
| 5,265,099 | 11/1993 | Feinstein | 371/28 |

OTHER PUBLICATIONS

"Introductory Circuit Analysis", Robert Boylestad, Merrill Publishing Company, 6th edition, 1990 (pp. 55–56 & pp. 93–102).

"Test System Control Technique Detecting Potential Short Circuit Defects by Use of a Voltage Screen", IBM Technical Disclosure Bulletin, vol. 28, No. 8, pp. 3582; Jan. 1986.

"Oxide Defect Detection System"; IBM Technical Disclosure Bulletin, vol. 31, No. 6, pp. 285–286; Nov. 1988.

Disclosed anonymously, 31728, "High Voltage Reliability Screen Using Stepped Pattern/Power Supply for CMOS Circuits"; Research Disclosure, Sep. 1990, No. 317, Kenneth Mason Publications Ltd., England.

*Latchup in CMOS Technology: The Problem and Its Cure*, by R. Troutman, Kluwer Academic Publishers, 1986, pp. 24–33 and 116–131.

*Intro to VLSI Silicon Devices*, by B. El–Kareh and R. J. Bomvard, Kluwer Academic Publishers, 1986, pp. 226–243, 488–495, and 518–541.

"Consistent Model for the Hot–Carrier Degradation in n–Channel and p–Cahnnel MOSFET's.", by P. Heremans, R. Bellens, G. Groeseneken and H. and H. Maes, IEEE Transactions on Electron Devices, vol. 35, No. 12, Dec. 1988, pp. 2194–2209.

*Primary Examiner*—Trinh L. Tu
*Attorney, Agent, or Firm*—Eugene I. Shkurko; Heslin & Rothenberg, P.C.

[57] ABSTRACT

A method for testing integrated circuit devices and electronic devices. An integrated circuit device has one or more electronic devices, each having a channel of a particular length. In order to test an integrated circuit device or an individual electronic device, a voltage is applied to the device under test. The amount of voltage applied is a function of the channel lengths of the device being tested and, in particular, it is a function of the shortest channel lengths existing in the device being tested. This ensures that a safe voltage is applied to the device being tested.

12 Claims, 2 Drawing Sheets

5,761,214

METHOD FOR TESTING INTEGRATED CIRCUIT DEVICES

TECHNICAL FIELD

This invention relates, in general, to integrated circuit devices and, in particular, to a method for testing an integrated circuit device to determine if latent defects exist within the device or whether the device is functioning as desired and is reliable.

BACKGROUND ART

The integrated circuit device industry has long recognized the need for reliable integrated circuit devices. Thus, integrated circuit devices are tested in order to determine whether any defects including, but not limited to, latent defects exist in the device to be used. In testing devices, such as integrated circuit devices, previously, dynamic voltage screens have been used.

A dynamic voltage screen has been used as a voltage screen on devices for years. In using dynamic voltage screens, standard test patterns are applied at as high a product voltage (Vdd) as can be tolerated in the presence of switching noise. When the voltage applied is too high, however, snapback and/or latchup occurs as a consequence of the switching noise. In one example, on a 5 V integrated circuit device, the product voltage (Vdd) is limited to the 6 to 8.5 V range due to occurrences of snapback and/or latchup.

In addition to the above, a pseudo static voltage screen has been described in "High Voltage Reliability Screen Using Stepped Pattern/Power Supply for CMOS Circuits," Research Disclosure, September 1990, Number 317, Kenneth Mason Publications Ltd., England, which is an attempt to solve the problem of switching noise. It describes the application of a test pattern at a snapback and/or latchup safe voltage, bumping the product voltage up to a higher static screen voltage, returning to the snapback and/or latchup safe voltage with no switching or pattern change occurring at the high voltage, then applying the next pattern. However, certain products, such as 5 V integrated circuit devices, have across chip channel length variations (either due to intentional design or process variations) which seriously limit the static voltage screen high voltage choice. That is, integrated circuit devices having the shortest channel lengths aggravate snapback and/or latchup problems. Also, the shortest devices would have hot carrier shifts in their characteristics as a consequence of applying the high voltage at static voltage screen.

Therefore, a need exists for a method of testing integrated circuit devices wherein the channel lengths of a device to be tested are taken into consideration. A need exists for a method of testing an integrated circuit device wherein the amount of voltage applied to the device is a function of one or more of the channel lengths of the device. A further need exists for a method of testing integrated circuit devices that is easy and reliable. Further, a need exists for a method of testing an electronic device having a channel wherein the voltage applied to the device is controlled as a function of the channel length of the electronic device.

DISCLOSURE OF INVENTION

The shortcomings of the prior art are overcome and additional advantages are provided in accordance with the principles of the present invention through the provision of a method for testing an integrated circuit device. The integrated circuit device has a plurality of electronic devices and each of the electronic devices has a channel of a particular length. The method includes applying a voltage to the integrated circuit and controlling the voltage being applied to the integrated circuit device as a function of the channel lengths. In one embodiment, the voltage being applied to the integrated circuit device is a function of a shortest channel length of one or more of the electronic devices.

In one embodiment, the controlling step includes selecting a maximum voltage to be applied to the integrated circuit device, predetermining from known electronic device characteristics a shortest channel length capable of receiving the maximum voltage and determining an amount of current drawn at the maximum voltage by one or more electronic devices having channel lengths which comprise the shortest channel length capable of receiving the maximum voltage.

In another example, a method for testing an integrated circuit device is provided. The integrated circuit device has a plurality of electronic devices and each of the electronic devices has a channel. The method includes selecting a maximum voltage to be applied to the integrated circuit device to be tested, predetermining from known electronic device characteristics a shortest channel length to receive the maximum voltage, determining an amount of current drawn at the maximum voltage by one or more electronic devices having channel lengths which comprise the shortest channel length, and applying the amount of current to the integrated circuit device.

In one example, at least some of the electronic devices are capable of being shut off and the amount of current to be applied to the integrated circuit device is determined by shutting off each of the electronic devices capable of being shut off and determining a total amount of OFF device leakage current for the devices which are shut off. Further, in another example, the amount of current is applied to a capacitor which is in parallel to the integrated circuit device and to internal capacitance of the integrated circuit device.

In another embodiment, the testing method further includes measuring the voltage across the integrated circuit device thereby determining a voltage output, measuring the current of the integrated circuit device at a low voltage, using the voltage output to determine whether any of the plurality of electronic devices being tested has a short channel length, and determining from the current measurement and the indication of whether any devices having a short channel exist whether any defects exist in the integrated circuit device.

In yet another embodiment, a method for testing an electronic device having a channel is provided. The method includes applying a voltage to the device and controlling the voltage applied to the device as a function of a length of the channel. In one example, the voltage applied to the device is ramped up from a first voltage to a second voltage and the second voltage is a function of the channel length of the electronic device.

In another embodiment, the step of controlling the voltage applied to the device includes selecting a maximum voltage to be applied to the electronic device, predetermining from known electronic device characteristics a shortest channel length to receive the maximum voltage, determining an amount of current drawn at the maximum voltage by the shortest channel length to receive the maximum voltage and applying the amount of current to the electronic device.

In accordance with the principles of the present invention, a method for testing integrated circuit devices is provided wherein the amount of voltage applied to the device under test is a function of at least one of the channel lengths of the device and, in particular, the amount of voltage applied is a function of the shortest channel lengths of the device under test. This advantageously reduces the problems of snapback and/or latch-up and the existence of hot carriers in short channel devices. The method of the present invention is easy and thus, economical.

BRIEF DESCRIPTION OF DRAWINGS

The subject matter which is regarded as the invention is particularly pointed out and distinctly claimed in the claims at the conclusion of the specification. The foregoing and other objects, features and advantages of the invention will be apparent from the following detailed description taken in conjunction with the accompanying drawings in which:

BEST MODE FOR CARRYING OUT THE INVENTION

In accordance with the principles of the present invention, a method for testing integrated circuit devices or individual electronic devices is provided. As used herein, an integrated circuit device is a structure including one or more electronic devices, each of which has a channel of a particular length. As used herein, channel refers to the end-to-end electrical path through a semiconductor body in, for example, a field-effect transistor. In addition, channel refers to processing parameters of other electronic devices, such as bipolar devices, wherein higher voltages applied to the devices result in concerns for too high of electric fields. In bipolar devices, the dopant profile is one example of a processing parameter that satisfies the above definition.

As described in detail herein, in order to test an integrated circuit device or an electronic device, a voltage is applied to the device under test in order to determine whether the device has any defects or is functioning as desired. (The device under test can be an integrated circuit device or an individual electronic device having a channel.) In one example, the voltage applied may be sufficiently high to cause latent defects existing in the device under test to become actual defects or in another example, the voltage may be sufficiently high to cause the device under test to microscopically explode.

The selection of the desired voltage to be used in determining whether the device under test is functioning properly or whether any defects exist in the device depends on whether the device under test includes any electronic devices with short channel lengths. (In one example, a short channel length may be any effective channel length less than 0.6 microns. However, this is only one illustrative example and it is possible that any other value may be selected to represent short channel lengths.) In particular, devices with short channel lengths cannot receive as much voltage as devices with longer channel lengths. If a device under test has short channel lengths and receives too high of a voltage, then snapback and/or latchup occurs or hot carrier shifts in the device under test occurs. On the other hand, for reliable test results, a sufficiently high voltage is to be selected without causing snapback, latchup or hot carrier shifts. Therefore, in accordance with the principles of the present invention, a method for testing integrated circuit devices or electronic devices is provided wherein the amount of voltage to be applied to the device under test is determined as a function of the channel lengths of the device under test. In particular, the amount of voltage to be applied is a function of the shortest channel lengths existing in the device under test, as described in detail below.

Figure 1:
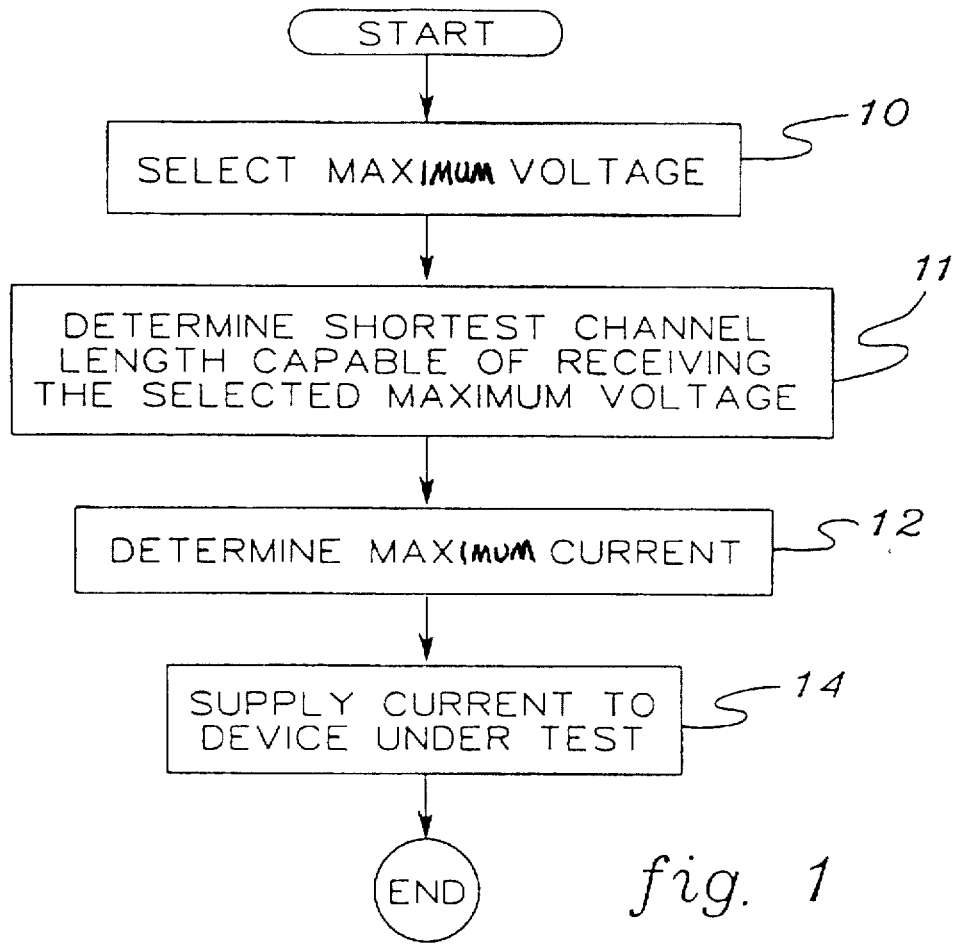
FIG. 1 illustrates one example of a block diagram of the testing method of the present invention.

The method of the present invention for testing devices, such as integrated circuit devices or electronic devices, is described in detail with reference to the flow diagram of FIG. 1. Initially, in one example, the maximum voltage which may be applied to the device under test is selected, STEP 10 "SELECT MAXIMUM VOLTAGE." In one instance, the maximum voltage to be applied to a device under test is twice the normal operating voltage of the device. For example, if a 5 V integrated circuit device is the device under test, then the maximum voltage to be applied to the device is 10 V. (It will be apparent to one of ordinary skill in the art that the maximum voltage may be a value other than twice the normal operating voltage, and that twice the normal operating voltage is only offered as a preferred example.) However, in accordance with the principles of the present invention, this maximum voltage value is applied only to those devices under test which are capable of receiving the maximum voltage. That is, if the channel lengths associated with a device under test are long enough to receive the maximum voltage, then the maximum voltage is applied to the device under test. On the other hand, if the device under test has one or more short channel lengths and, therefore, should not receive the maximum voltage, then as described below, a lesser voltage is applied. This lesser voltage is, in accordance with the principles of the present invention, determined as a function of the shortest channel lengths of the device under test.

In one instance, in order to determine which channel lengths are of sufficient length to receive the maximum voltage, known independent experiments are performed wherein snapback, latchup and hot carrier effects are determined as a function of channel length and voltage. One or more of these known experiments are described in the following publications, each of which is hereby incorporated by reference:

(1) *Latchup in CMOS Technology: The Problem and Its Cure*, by Ronald R. Troutman, Kluwer Academic Publishers, 1986.

(2) *Intro to VLSI Silicon Devices*, by Badih El-Kareh, Richard J. Bombard, Kluwer Academic Publishers, 1986.

(3) *Consistent Model for the Hot Carrier Degradation in N Channel and P Channel MOSFET'S*, By Paul Hermans, Rudy Bellens, Guido Groeseneken, Herman E. Maes, IEEE Transactions on Electron Devices, Vol. 35, #12, December 1988.

The above experiments (which in another example, do not have to be independently performed) produce the value of the shortest channel length that is capable of receiving the chosen maximum voltage, STEP 11 "DETERMINE SHORTEST CHANNEL LENGTH CAPABLE OF RECEIVING SELECTED MAXIMUM VOLTAGE". Should the channel lengths associated with a device under test all be greater than or equal to the shortest channel length capable of receiving the selected maximum voltage, then the maximum voltage is applied to the device under test. However, if shorter channel lengths are present, then a lesser voltage is applied, as described in greater detail below.

In addition to selecting the maximum voltage to be applied to the device under test and determining the shortest channel length capable of receiving the maximum voltage, a maximum current limit (Ips) is determined, in accordance with the principles of the present invention, STEP 12 "DETERMINE MAXIMUM CURRENT LIMIT." In one example, in order to determine the maximum current limit to be applied to the device under test, the selected maximum voltage and the value of the shortest channel length to receive the maximum voltage are used.

In particular, the maximum current limit is equal to the amount of current drawn at the maximum voltage by the shortest channel length, as well as other short channel lengths capable of receiving the maximum voltage. (The total current of the integrated circuit device is dominated by the OFF current of the individual electronic devices with the shortest channel lengths. Thus, the shortest channel lengths can include the shortest channel length to receive the maximum voltage, as described above, as well as various other channel lengths close in size to the shortest length (e.g., 0.6 microns, 0.61 microns, and 0.62 microns)). The maximum current limit is determined in one example in a separate experiment in which current is applied to a sample device under test (or in another example, it can be the same as the device under test). In the experiment, an observation is made as to how high the current rises as a function of the voltage without a current limit sufficient to protect the short channels. Then, for example, the maximum current limit can be chosen as a value lower than the point at which snapback and/or latchup occurs by a chosen safety margin.

Figure 2:
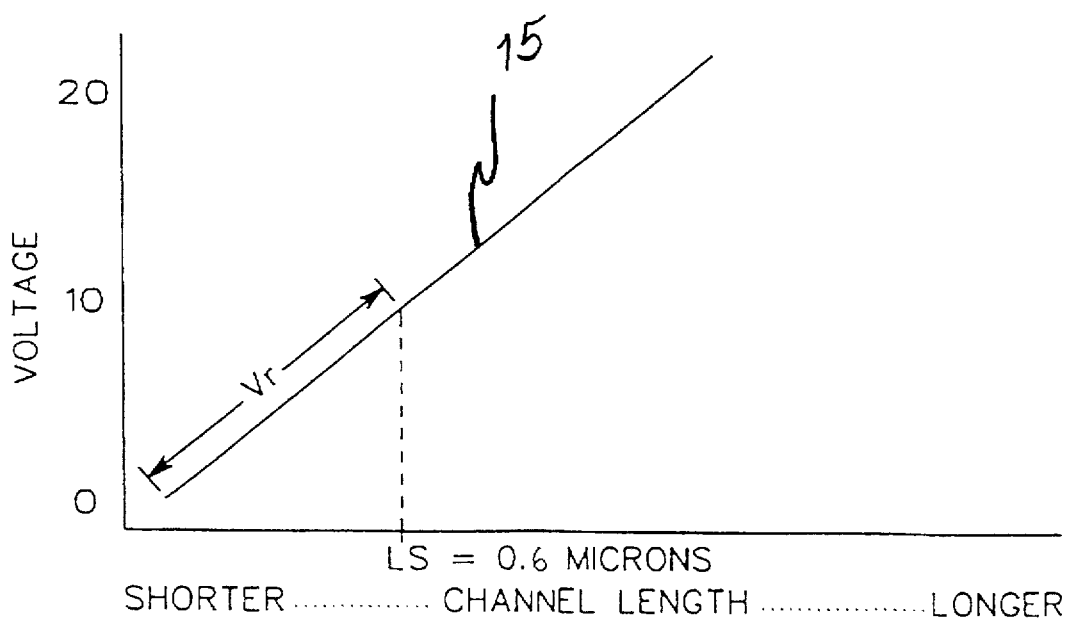
FIG. 2 depicts one graphical representation of a voltage versus channel length plot, in accordance with the principles of the present invention.

Referring to FIG. 2, the generalized relationship between voltage, channel length and current (not shown) is described in greater detail with reference to one specific example. As the channel length of an electronic device increases (horizontal axis), so does the voltage (vertical axis), as generally indicated by line 15, unless it is limited in some manner. In the example shown, given that the maximum voltage applied to a 5 V device under test is 10 V, the shortest channel length (Ls) that can receive 10 V is 0.6 microns, as determined previously. From this information, it is determined that the current drawn at 10 V by a channel length of 0.6 microns is 40 ma (not shown). This is the maximum current limit (Ips). Subsequently, a determination is made as to the voltage rolloff (Vr) from 10 V resulting at 40 ma of current on devices with channel lengths shorter than 0.6 microns. The voltage rolloff is the output voltage of the device under test. The resultant plot is shown in FIG. 2. Since current rises rapidly with decreasing channel length, the resultant voltage rolloff (Vr) is sufficient to protect against snapback/latchup and hot carriers on devices with channel lengths shorter than Ls (in this example 0.6 microns).

In another example, the maximum current limit can be specified by determining the amount of OFF device leakage for the device under test having shorter channel lengths. OFF device leakage is the combined leakage current for all of the electronic devices that are turned off when the integrated circuit device is placed in a state that minimizes any ON paths. The amount of OFF device leakage would then represent the maximum current limit for the device under test, as well as for other integrated circuit devices and electronic devices having similar channel length distributions to the device under test.

Referring again to FIG. 1, subsequent to determining the maximum current limit, in one example, an amount of current equal to the maximum current limit is supplied to the device under test, as described in further detail below, STEP 14 "SUPPLY CURRENT TO DEVICE UNDER TEST."

Figure 3:
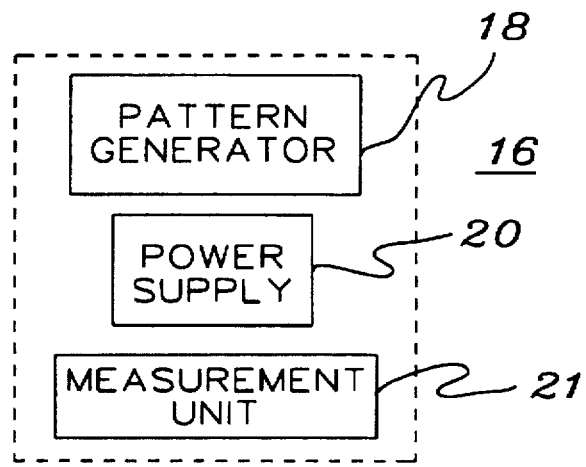
FIG. 3 depicts one example of a tester used with the testing method of FIG. 1, in accordance with the principles of the present invention.

In one embodiment, the current is supplied to the device under test by using a standard tester 16, such as the one depicted in the block diagram of FIG. 3. Referring to FIG. 3, in one example, tester 16 is, for example, a Teradyne J937 and includes, for instance, a pattern generator 18, a power supply 20 and a measurement unit 21. Pattern generator 18 generates any test patterns desired to be used in testing the device under test and power supply 20 provides current to the device under test. (In one embodiment, test patterns are not utilized and thus, the pattern generator would not be needed.) In accordance with the principles of the present invention, power supply 20 receives as input the selected maximum voltage and the determined maximum current limit (Ips), described above. Measurement unit 21 includes a voltmeter, which is used to measure the voltage rolloff, described above, and an ampmeter used to measure the total current of the device under test.

Figure 4:
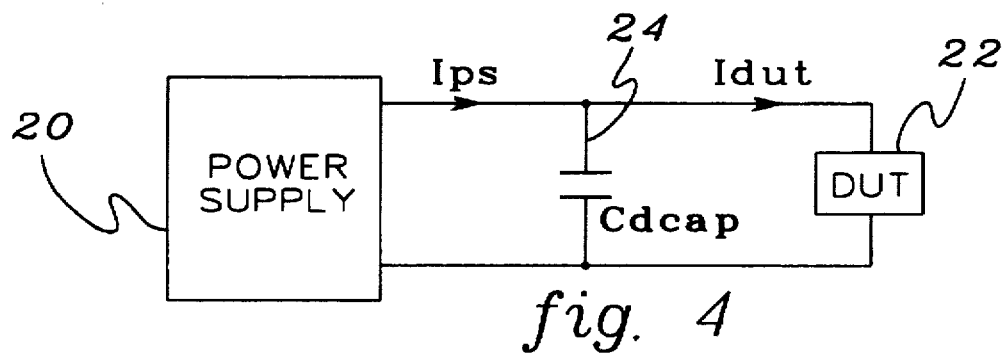
FIG. 4 is one example of a circuit used in performing the testing method of FIG. 1, in accordance with the principles of the present invention.

As illustrated in the circuit diagram of FIG. 4, power supply 20 supplies current to a device under test (DUT) 22. As previously discussed, device under test 22 may include one electronic device, such as a field-effect transistor, or an integrated circuit with a plurality of electronic devices. In particular, in one example, an amount of current equal to the maximum current limit (Ips), determined in accordance with the principles of the present invention, is supplied from power supply 20 to a decoupling capacitor 24 (Cdcap) and the internal capacitance of device under test 22. Decoupling capacitor 24 is in parallel with device under test 22 and includes, for example, sixteen discrete capacitors in parallel, each capacitor having a value of 6.8 microfarads. Decoupling capacitor 24 is used to determine the ramp rate of the voltage of the device under test using known relationships for charging capacitors with current. The values for the capacitors are selected such that the voltage of the device under test increases monotonically, thereby preventing the voltage from increasing to an undesirable value.

In another example, if the device under test has a sufficient amount of internal capacitance to produce a smooth ramp of voltage, then decoupling capacitor 24 is not needed. Instead, the capacitance of the device under test is relied upon to supply the capacitance needed to produce a smooth ramp of voltage.

Figure 5:
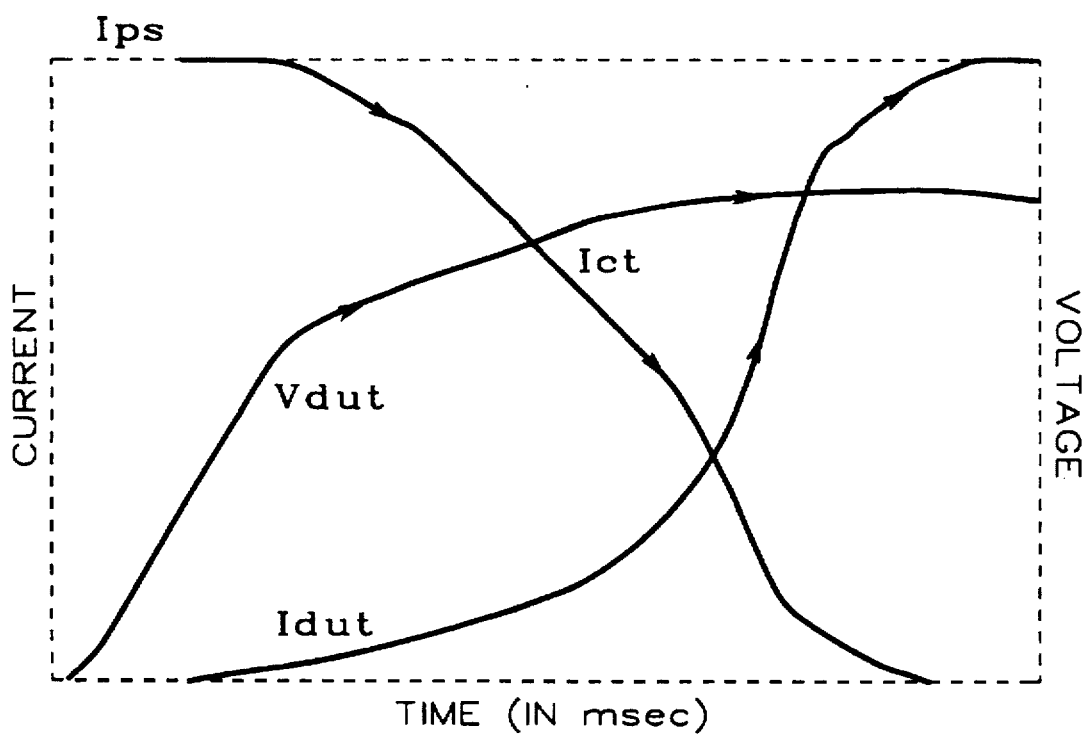
FIG. 5 is one graphical representation showing that the voltage of the device under test is rising, as the total capacitive charging current drops off, in accordance with the principles of the present invention.

Referring to the circuit of FIG. 4 and the graphical representation of FIG. 5, initially, when the maximum current (Ips) is supplied from the power supply, virtually all of the current goes through and charges up capacitor 24 (Cdcap) and the internal capacitance of the device under test. Then, eventually, the total current (Ict) (FIG. 5) drawn by capacitor 24 and the internal capacitance drops off as the current (Idut) in the device under test rises with the charging voltage (Vdut) of capacitor 24 and the internal capacitance of the device under test. (In the case of a device under test having a short channel, the total capacitive charging current (Ict) drops off to zero.) As the voltage of the device under test increases, the current (Idut) of the device under test rises taking away from the current which is charging the capacitors. Thus, the voltage being applied to the device under test stops at a voltage (Vr) which is dependent on the current (Idut) that the device under test draws. Therefore, in accordance with the principles of the present invention, the amount of voltage to be applied to the device under test is controlled by the shortest channel lengths in the device under test. That is, when a maximum amount of current is supplied to the device under test, devices with shorter channel lengths draw the maximum current at a lower voltage than devices with longer channel lengths. In the case of a long channel length device, however, the voltage of the device under test (Vdut) rises until the maximum voltage (e.g. 10 V) of power supply 20 is reached.

The following is one illustrative example of testing an integrated circuit device, using the method of the present invention, as described in detail above: Initially, a first test pattern generated by pattern generator 18 of tester 16 is applied to device under test 22. Subsequently, tester 16, and in particular power supply 20 is used to supply current to the device under test and, in particular, to capacitor 24 and the internal capacitance of the device under test. The capacitance causes the voltage applied to the device under test to ramp from zero or normal operating voltage until the maximum voltage set on the power supply is reached or the maximum current limit is reached, whichever occurs first. After the maximum voltage or the maximum current is reached, the pattern output from the device under test is observed and if it is different from the pattern that was applied to the device, then one or more defects exist within the device under test. Subsequently, the voltage is brought down again and a second test pattern may be applied. The above procedure is repeated for each test pattern that is to be applied.

It will be apparent to those of ordinary skill in the art that the above example is only one way in which the technique of the present invention may be used. It is also possible that no patterns are generated and that simply, a voltage is applied to the device under test. The voltage is, in accordance with the principles of the present invention, a function of the shortest channel lengths associated with the device under test. In order to determine if any defects exist, the total current of the device under test is measured before and after the voltage is applied to the device under test by measurement unit 21, specifically an ampmeter. If the current is appreciably different or abnormally high after the voltage is applied, then one or more defects exist.

As described above, the technique of the present invention for testing integrated circuit devices is used to determine whether any latent defects exist in the device or whether the device is functioning as desired and is reliable. However, in using the above technique, some defects may not be observed. For instance, defects which cause a type of latchup which is only stable at high voltage conditions or defects which become apparent with low voltage OFF current. In particular, the increase in defect related current with voltage is less than short channel related current increases with voltage, thus, using the above technique, some defects may not be observed if short channels are thought to be present in the device. Therefore, using the principles of the present invention and the technique described below, additional defects are observed.

Initially, as described previously with reference to FIG. 1, the maximum voltage to be applied to the device under test is selected, the shortest channel length capable of receiving the selected maximum voltage is determined, the maximum current applied to the device under test is determined and the maximum amount of current is supplied to the device under test. Thereafter, in one embodiment, the voltage rolloff (Vr) of the device under test is measured using measurement unit 21 and, in particular, a voltmeter. Then, from the value of the voltage rolloff, a determination can be made as to whether any electronic devices having short channel lengths exist in the device under test. In particular, if the voltage rolloff is equal to or close to the maximum voltage, then it can be inferred that no devices having short channel lengths exist.

In addition to the above, the low voltage OFF current (i.e., the current measured at the normal operating voltage when the electronic devices of the device under test are turned off) is measured using measurement unit 21, and in particular an ampmeter. If the low voltage OFF current is high (e.g., 4 ma) and an inference is made that no devices having short channel lengths exist in the device under test, then defects are present in the device. On the other hand, if the low voltage OFF current is at a normal level (e.g., 0.2 ma) and inference is made that no devices having short channel lengths exist, then no defects are detected.

Using the above testing techniques of the present invention, a determination can be made as to whether defects are present in devices under test. This allows for the production of more reliable integrated circuit devices.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method for testing an integrated circuit device, said integrated circuit device having a plurality of electronic devices, each of said plurality of electronic devices having a channel of a predetermined length, said testing method comprising the steps of:

applying a voltage to said integrated circuit device; and controlling said voltage being applied to said integrated circuit device as a function of channel lengths.

2. The testing method of claim 1, wherein said controlling step comprises the step of controlling said voltage being applied to said integrated circuit device as a function of a shortest channel length of one or more of said electronic devices.

3. The testing method of claim 1, wherein said controlling step further comprises the steps of:

selecting a maximum voltage to be applied to said integrated circuit device;

predetermining from known electronic device characteristics a shortest channel length capable of receiving said maximum voltage; and determining an amount of current drawn at said maximum voltage by one or more electronic devices having channel lengths which comprise the shortest channel length capable of receiving said maximum voltage.

4. The testing method of claim 3, further comprising the step of applying said amount of current to said integrated circuit device.

5. The testing method of claim 3, wherein at least some of said plurality of electronic devices are capable of being shut off and wherein said current determining step further comprises the steps of:

shutting off said at least some of said plurality of electronic devices; and determining a total amount of OFF device leakage current for said at least some of said plurality of electronic devices which are shut off.

6. A method for testing an integrated circuit device, said integrated circuit device having a plurality of electronic devices, each of said plurality of electronic devices having a channel, said testing method comprising the steps of:

(a) selecting a maximum voltage to be applied to said integrated circuit device to be tested;

(b) predetermining from known electronic device characteristics a shortest channel length capable of receiving said maximum voltage;

(c) determining an amount of current drawn at said maximum voltage by one or more electronic devices having channel lengths which comprise the shortest channel length of predetermined step (b); and (d) applying said amount of current to said integrated circuit device.

7. The testing method of claim 6, wherein at least some of said plurality of electronic devices are capable of being shut off and wherein said current determining step (c) further comprises the steps of:

(e) shutting off said at least some of said electronic devices; and (f) determining a total amount of OFF device leakage current for said at least some of said plurality of electronic devices which are shut off in step (e).

8. The method of claim 6, wherein said applying step comprises the step of applying said amount of current to a capacitor in parallel to said integrated circuit device and to internal capacitance of said integrated circuit device.

9. The testing method of claim 6, further comprising the steps of:

(e) measuring the voltage drop across said integrated circuit device thereby determining a voltage output;

(f) measuring the current of said integrated circuit device at a low voltage;

(g) using said voltage output to determine whether any of said plurality of electronic devices has a short channel length; and (h) determining from step (f) and step (g) whether any defects exist in said integrated circuit device.

10. A method for testing an electronic device having a channel, said method comprising the steps of:

applying a voltage to said device; and controlling said voltage applied to said device as a function of a length of said channel.

11. The method of claim 10, wherein said controlling step comprises the step of ramping up said voltage from a first voltage to a second voltage, said second voltage being a function of said length of said channel.

12. The method of claim 10, wherein said controlling step comprises the steps of:

selecting a maximum voltage to be applied to said electronic device;

predetermining from known electronic device characteristics a shortest channel length capable of receiving said maximum voltage;

determining an amount of current drawn at said maximum voltage by said shortest channel length to receive said maximum voltage; and applying said amount of current to said electronic device.

* * * * *